United States Patent
Mazzaro et al.

(10) Patent No.: US 9,280,617 B2
(45) Date of Patent: *Mar. 8, 2016

(54) SYSTEMS AND METHODS FOR IMPROVED RELIABILITY OPERATIONS

(71) Applicant: General Electric Company, Schenectady, NY (US)

(72) Inventors: Maria Cecilia Mazzaro, Simpsonville, SC (US); Frederick William Block, Campobello, SC (US); Pablo Enrique Acevedo Giraldi, Simpsonville, SC (US); Charles Scott Sealing, Clifton Park, NY (US); Atanu Talukdar, Karnataka (IN); Mark Andrew Runkle, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 606 days.

This patent is subject to a terminal disclaimer.

(21) Appl. No.: 13/670,420

(22) Filed: Nov. 6, 2012

(65) Prior Publication Data

US 2014/0129187 A1  May 8, 2014

(51) Int. Cl.
*G06F 17/50* (2006.01)
*G05B 23/02* (2006.01)

(52) U.S. Cl.
CPC ........ *G06F 17/5009* (2013.01); *G05B 23/0251* (2013.01); *G05B 23/0283* (2013.01)

(58) Field of Classification Search
CPC ........... G05B 23/0251; G05B 23/0283; G05B 11/01; G05B 9/02; G06F 17/5009; G01M 99/005

USPC .............. 702/181, 183, 184, 185; 700/29, 79, 700/287; 703/6

See application file for complete search history.

(56) References Cited

U.S. PATENT DOCUMENTS

| | | | |
|---|---|---|---|
| 6,217,076 | B1 | 4/2001 | Howard et al. |
| 2006/0041459 | A1 | 2/2006 | Hester et al. |
| 2008/0228314 | A1 | 9/2008 | Sjostrand et al. |
| 2009/0076874 | A1 | 3/2009 | Gross |
| 2009/0299800 | A1 | 12/2009 | Neilan et al. |

(Continued)

FOREIGN PATENT DOCUMENTS

| | | |
|---|---|---|
| CN | 101764405 A | 6/2010 |
| EP | 00467257 A3 | 1/1992 |

(Continued)

OTHER PUBLICATIONS

U.S. Appl. No. 13/670,435, filed Nov. 6, 2012, Frederick William Block.

(Continued)

*Primary Examiner* — John H Le
(74) *Attorney, Agent, or Firm* — Fletcher Yoder, P.C.

(57) ABSTRACT

A system may include a model library configured to model a system, wherein the model library includes a plurality of subsystem models, and each of the plurality of subsystem models is configured to derive a reliability measure. The system further includes a fault tolerance input and a maintenance policy input. The system further includes a dynamic risk calculation engine (DRCE) configured to use a user-defined set of the plurality of subsystem models, the fault tolerance input and the maintenance policy input, to derive a system risk for an apparatus.

18 Claims, 9 Drawing Sheets

(56) References Cited

U.S. PATENT DOCUMENTS

| | | | |
|---|---|---|---|
| 2011/0172973 A1 | 7/2011 | Richards et al. | |
| 2014/0129000 A1* | 5/2014 | Block et al. | 700/79 |

FOREIGN PATENT DOCUMENTS

| | | | |
|---|---|---|---|
| EP | 1923825 A2 | 5/2008 | |
| JP | 63300358 | 12/1988 | |
| JP | 05028160 | 2/1993 | |
| JP | 10185768 A | 7/1998 | |
| JP | 11345019 A | 12/1999 | |
| JP | 2000322399 A | 11/2000 | |
| JP | 2001100822 A | 4/2001 | |
| JP | 2011138385 A | 7/2011 | |
| JP | 2004170225 A | 6/2014 | |
| WO | 2011/088243 A1 | 7/2011 | |

OTHER PUBLICATIONS

U.S. Appl. No. 13/431,914, filed Mar. 27, 2012, Maria Cecilia Mazzaro.

Julia V. Bukowski, Modeling and Analyzing the Effects of Periodic Inspection on the Performance of Safety-Critical Systems; p. 321-329, IEEE Transactions on Reliabilty, vol. 50, No. 3, Sep. 2001.

H. Cheddie and W. Goble, Safety Instrumented Systems, Practical Probabilistic Calculations, 2005. Appendix F and G, ISA, Research Triangle Park, NC, USA.

* cited by examiner

US 9,280,617 B2

SYSTEMS AND METHODS FOR IMPROVED RELIABILITY OPERATIONS

BACKGROUND OF THE INVENTION

The subject matter disclosed herein relates to operations, and more specifically, to reliability operations.

Machine systems, including turbomachine systems, may include a variety of components and subsystems participating in a process. For example, a turbomachine may include fuel lines, combustors, turbine system, exhaust systems, and so forth, participating in the generation of power. The components and subsystems may additionally include a safety instrumented system (SIS) suitable for monitoring the process, and determining if the process is operating within certain safety limits. The SIS may automatically actuate certain devices, such as field devices (e.g., valves, pumps), to bring the process back into a desired safety range. However, machine systems may be complex, including numerous interrelated components and subsystems. Accordingly, recognizing or predicting a reliability of operations, such as SIS operations, may be difficult and time-consuming.

BRIEF DESCRIPTION OF THE INVENTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In a first embodiment, a system includes a model library configured to model a system, wherein the model library comprises a plurality of subsystem models, and each of the plurality of subsystem models is configured to derive a reliability measure. The system further includes a fault tolerance input and a maintenance policy input. The system further includes a dynamic risk calculation engine (DRCE) configured to use a user-defined set of the plurality of subsystem models, the fault tolerance input and the maintenance policy input, to derive a system risk for an apparatus.

In a second embodiment, a method includes using a model library to build a risk model. The method further includes a reliability measure based on the risk model and on an input. The method additionally includes deriving an action based on the reliability measure, wherein the risk model comprises at least one failure state, one okay state, at least one derated state, at least one repair rate transition, and at least one failure rate transition.

In a third embodiment, a system includes a controller configured to control a machine system and to receive inputs from the machine system, wherein the controller comprises non-transitory machine readable instructions configured to use a model library to build a risk model. The instructions are further configured to derive a reliability measure based on the risk model and on an input. The instructions are additionally configured to derive an action based on the reliability measure, wherein the risk model comprises at least one failure state, one okay state, at least one derated state, at least one repair rate transition, and at least one failure rate transition.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
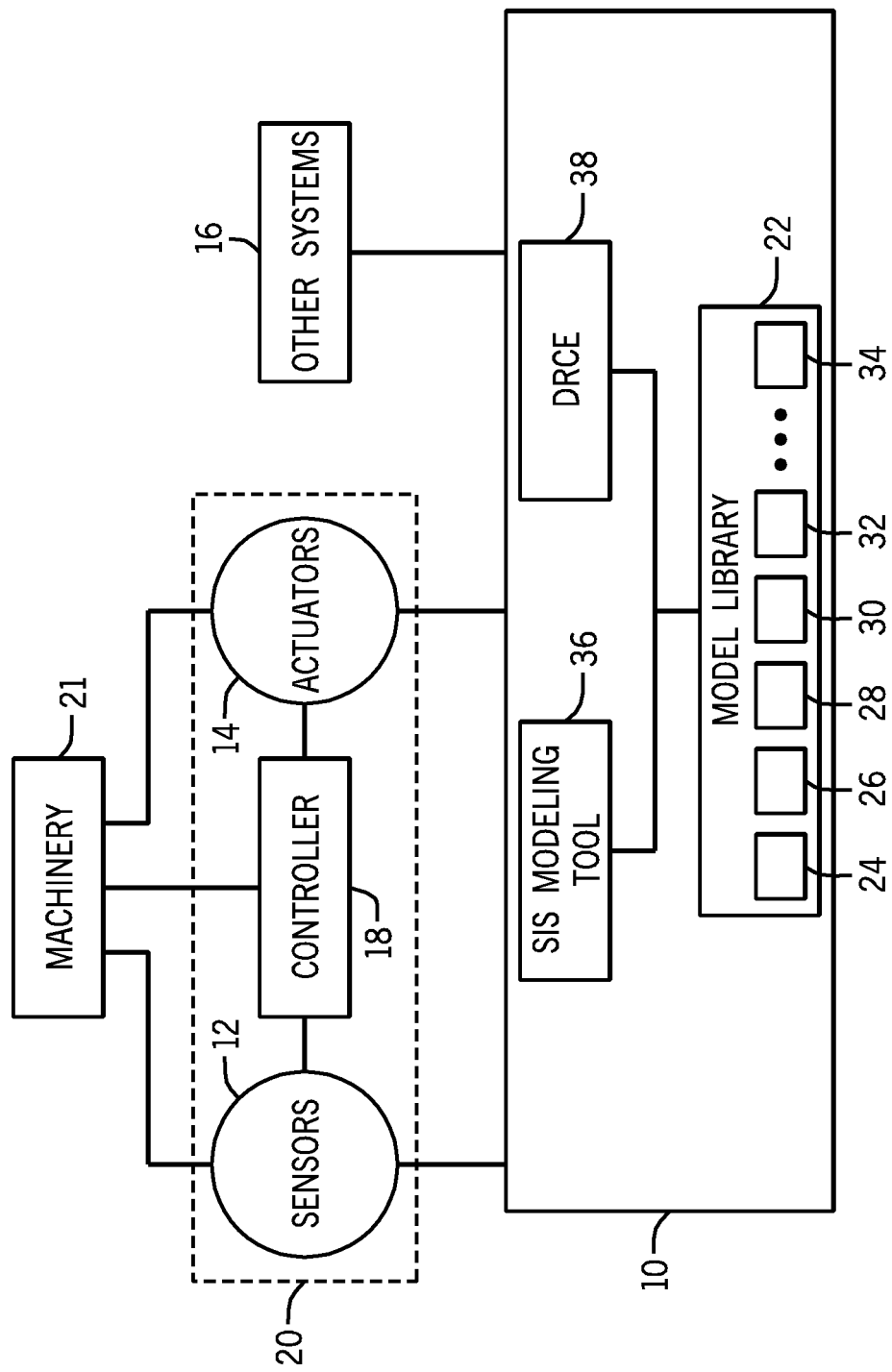
FIG. 1 is a block diagram of an embodiment of a model-based reliability system (MRS)

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

In certain embodiments, safety operations for an industrial process and associated machinery may be provided by a safety instrumented system (SIS). In these embodiments, the SIS may be implemented as one or more safety instrumented functions (SIFs). A SIF may include three main functional blocks; a sensing block providing sensors suitable for monitoring the industrial process, a logic solver block providing a controller suitable for deriving safety actions based on monitoring information provided by the sensing block, and an actuation block providing final elements (which may include flashing lights, sirens, and/or remote actuated valves) that may be driven by the logic solver block's controller to maintain the process within safe limits. By implementing the SIF on a machinery or process, such as a power generation process, undesired conditions may be detected and acted upon to maintain a desired safety integrity level (SIL). For example, the International Society of Automation (ISA) document S84.01 and the International Electrotechnical Commission (IEC) document 61508 provide for certain SIL levels (e.g., SIL 1, SIL 2, SIL 3, and SIL 4) that may be assigned to a given SIF. Higher SIL levels are correlative with improved safety. That is, a SIF using a SIL 4 is deemed more reliable than a SIF using a SIL 3, 2, or 1.

Additionally, each SIL may be correlated with or based on meeting a performance measure, such as a probability of failure on demand (PFD), mean time to failure (MTTF), mean time between failure (MTBF), safe failure fraction (SFF), hardware failure tolerance (HFT), and a risk reduction factor (RRF). For example, for processes under continuous operation, IEC 61508 defines SIL 3 as having a PFD per hour of approximately between 0.001-0.0001 and an RRF of approximately between 1,000-10,000. Accordingly, a SIF overseeing continuous operations of a continuous process may be certified as SIL 3 if the SIF can be shown to meet the aforementioned RRF or PFD. In some cases, the RRF and/or the PFD may be derived based on historical data. That is, if the SIF is allowed to operate for a certain amount of time, then the historical performance may be used to derive the RRF and/or the PFD. However, this operating history manner of derivation may take an inordinate amount of time, and may not be possible for new systems under design.

Certain modeling techniques may be used in lieu of historical observations, suitable for deriving performance measures for the SIF (e.g., PFD, RRF). For example, Fault Tree Analysis (FTA), reliability block diagrams (RBDs), risk graphs, and/or layer of protection analysis (LOPA) may be used to analyze the SIF and derive the performance measures. Additionally or alternatively, Markov models may be used to analyze the SIF. Before usage of the techniques described herein, modeling efforts focused on modeling specific systems, and the resulting models may not be reused and/or applied to other systems. For example, a turbine system, such as the 9F turbine system, available from General Electric Co., of Schenectady, N.Y., may be provided in a variety of configurations depending on customer needs, site selection, regulatory requirements, business requirements, and so forth. Each installation of the 9F turbine may thus result in a different set of SIFs, based on the chosen configuration. Without the techniques disclosed herein, each installation may use a new model specific to the particular installation without reuse of previous models and associated data. That is, the SIFs for each installation were modeled "from scratch." It is to be noted that the techniques described herein may be used in other turbine systems, such as a 7F, 7FA, 9FA or other systems provided by General Electric Co., or by others.

The novel techniques described herein enable the building of a library of component models, and re-using the library to model a variety of configurations and systems, as described in more detail below. By providing for a re-usable set of models, the time and effort spent in analyzing the SIFs and/or other systems (e.g., turbomachinery and turbomachinery subsystems) for a specific system configuration may be substantially reduced. Further, the models may provide for different inputs used to analyze the SIFs and/or other systems. For example, an online diagnosis input may be used by the models to detect and correct failures of a SIF, or to tune other system performance. An output diagnosis input may be used to drive the system protected by the SIF to a safe state. This output diagnosis is typically mutually exclusive from the online diagnosis. That is, a detected failure may be used to trip the system into a safe state. A proof test input may be used, suitable to derive a more efficient proof test schedule. Likewise, a full refurbishment input may be used to derive a more efficient restoration of the SIF to an "as new" condition. Additionally, the library of models may be used by a modeling tool that may enable the graphical manipulation of the component models to more easily analyze the specific configuration. For example, various component models may be selected from the library, and placed by the user in synchronous and/or asynchronous arrangements, to construct the desired configuration. Advantageously, the modeling tool may then automatically analyze the user-selected configuration, and derive the performance measures (e.g., PRD, RRF, SIL) and related risks.

Further, a dynamic risk calculation engine (DRCE) tool may be provided. The DRCE may derive a risk and related performance measures for the SIF, using for example, the models (e.g., Markov models, FTA, RBD, risk graphs, LOPA) and model inputs (e.g., online diagnosis, output diagnosis, proof test optimization, full refurbishment) described herein. In one embodiment, the DRCE tool may be loaded with the user-selected SIF and/or other system configuration and model input, and used to update the SIF performance measures during the SIF's lifetime. For example, the DRCE may continuously monitor SIF components, as well as related machinery (e.g., sensors, controllers, final elements), electronic logs, paper logs, operational events, maintenance events, repair events, and the like, and continuously update the SIF's performance measures. The DRCE may enable actions based on the model input, performance measure, and reliability derivations. Indeed, the DRCE may drive certain equipment to command proof tests, drive subsystems to safe states, and or correct possible SIF failure. Additionally, the occurrence of unexpected events, such as operational events including but not limited to a turbine trip, full load rejection, overspeed events, and so forth, may be used as a performance "credit" in lieu of the occurrence of certain planed events, such as proof tests. That is, the unexpected event may be used in lieu of the scheduled test (e.g., partial proof test, full proof test). In this way, historical events may be "credited," and the SIFs performance measures updated.

Additionally, the DRCE may receive inputs, such as a component failure and repair rates, a user-selected SIF configuration, a system configuration, and a desired system-level RRF. The DRCE may then simulate the passage of time by using the aforementioned component models of the model library, and provide a maintenance schedule (e.g., proof test schedule) that meets the desired RRF. Additionally, the simulation inputs may include real-time or near real-time data for a process and associated equipment, such as operational events (e.g., hours fired, temperatures, pressures, speed, flow rates, fuel usage) and/or unexpected events. These inputs may then be used to derive more accurate reliability predictions. Further, calculations performed by the DRCE may then be used as inputs into optimization systems, such as maintenance optimization systems, operational optimization systems, and/or economic optimization systems, and used to derive optimization actions (e.g., maintenance actions, operational actions, and/or economic actions). For example, by more efficiently scheduling maintenance, the simulation engine may provide for a substantial reduction in unexpected downtime, increased equipment utilization, reduced costs, and improved machinery and process efficiency.

The DRCE may dynamically model risk for any system, in addition to or alternative to a SIF, during the operation of the modeled system. For example, FIG. 9 describes a Markov model that may be used to model any number of systems and subsystems, including turbomachinery, to describe failure states and derated states based on data received during operation of the system. By determining the risk of operations, the DRCE can then derive the aforementioned reliability predictions and inputs into optimization systems, such as maintenance optimization systems, operational optimization systems, and/or economic optimization systems.

With the foregoing in mind and turning now to FIG. 1, the figure is a block diagram illustrating an embodiment of a model-based reliability system (MRS) 10 that may be communicatively coupled to sensors 12 and final elements 14. The MRS 10 may also be communicatively coupled to other systems 16, such as electronic logs (e.g., maintenance databases), paper logs, power production logs, manufacturer records (e.g., expected lifetime data, repair data, refurbishment data), industry records (e.g., industry failure rate data, industry standards), economic markets (e.g., power futures market, cap and trade markets, "green" credit markets), regulatory systems (e.g., regulatory compliance systems, pollution control systems), insurance systems (e.g., lost power production revenue insurance, business interruption insurance), maintenance optimization systems, operational optimization systems, economic optimization systems, and so on. The MRS 10 may be provided as a subsystem of a controller 18, and may include non-transitory machine readable media storing code or computer instructions that may be used by a computing device (e.g., the controller 18) to implement the techniques disclosed herein. In other embodiments, the MRS 10 may be included in a distributed control system (DCS), a manufacturing execution system (MES), a supervisor control and data acquisition (SCADA) system, and/or a human machine interface (HMI) system.

The sensors 12 may provide inputs to a SIF 20, and may include, for example, pressure sensors, temperature sensors, flow sensors, status and position indicators (e.g. limit switches, Hall effect switches, acoustic proximity switches, linear variable differential transformers (LVDTs), position transducers), and the like, connected to a machinery 21. The machinery 21 may be any type of power production machinery (e.g., gas turbine system, steam turbine system, wind turbine system, hydroturbine system, combustion engine, hydraulic engine, electric generator), and non-power production machinery (e.g., pump, valve).

As mentioned above, the SIF 20 may be used to monitor a process, such as a power generation process related to the machinery 21, to maintain the process within safety limits. Accordingly, the SIF 20 may use the sensors 12 to continuously monitor the process. A SIF 20 logic, such as a logic included in the controller 18, may then derive certain actions based on the sensor 12 inputs. For example, if a pressure measure is deemed outside of a safety range, then the SIF 20 logic may actuate one or more final elements 14 to open a pressure relief valve. Likewise, if a temperature rises over a desire temperature limit, then the SIF 20 logic may operate the final elements 14 to deliver cooling fluids. The final elements 14 may include switches, valves, motors, solenoids, positioners, and other devices, suitable for moving or controlling a mechanism or system. The SIF 20 logic may include non-transitory machine readable media storing code or computer instructions that may be used by a computing device (e.g., the controller 18) to monitor the sensors 12 and actuate the final elements 14. By monitoring the sensors 12 and responding accordingly through the final elements 14, the SIF 20 may be used to more safely operate the process.

Depending on the process and standards used (e.g., ISA S84.10, IEC 61508), the SIF 20 may be provided so as to enable a desired performance measure (e.g., SIL, PFD, RRF). Accordingly, a specific SIF 20 model may be constructed using techniques such as Markov models, FTA, RBD, risk graphs, and/or layer protection analysis (LOPA), and used to derive the SIF's 20 performance measures. However, the SIF 20 is generally designed to support a specific process, including specific machinery 21. For example, the SIF 20 may be designed to support overspeed protection operations of a turbine system having an analog tachometer. In another similar overspeed protection process, a digital tachometer may be used. Generally, the SIF 20 may have to be re-analyzed to arrive at the new performance measures used in supporting the new, albeit similar, equipment. Because of the number, complexity, and interrelationship of equipment, such as the 9F turbine equipment included in a power generation process, the SIF modeling effort may be quite considerable in terms of time and cost. Every new derivation of the 9F turbine, as well as every new installation, may be modeled anew. By providing for a model library 22 including component models 24, 26, 28, 30, 32 and 34, the techniques disclosed herein may substantially reduce the modeling effort In the depicted embodiment, the component models 24, 26, 28, 30, 32 and 34 may be created by a SIS modeling tool 36. For example, the SIS modeling tool 36 may receive inputs describing details of the equipment and systems used in the process, such as failure rates for sensors 12 and final elements 14, details of the specific configuration of the 9F turbine and supporting equipment, details of the power generation process, maintenance details (e.g., proof test intervals, maintenance schedules, personnel), desired level of performance (e.g., SIL level), and so forth. The inputs may also include a modeling methodology, such as FTA, RBD, risk graphs, LOPA, and/or Markov modeling. Markov models may be particularly apt for the creation of the component models 24, 26, 28, 30, 32 and 34, insofar as the Markov models may more easily model states, state interactions, and time dependency, as described in more detail below with respect to FIGS. 5 and 8.

The SIS modeling tool 36 may be used to model all aspects of the desired process and equipment as components or subsystems. That is, instead of creating a single model focused on a specific process and equipment configuration, multiple component models 24, 26, 28, 30, 32 and 34 focused on various configurations for the process and equipment are provided. For example, for a given subsystem, such as a speed overload protection subsystem, rather than building a single model, a variety of models 24, 26, 28, 30, 32 and 34, may be created based on the various possible configurations of the overspeed protection subsystem. In one Markov model example, various XooN models may be built, where N denotes the total number of components in the subsystem, and X denotes the number of components that have to be operational to enable the subsystem to work as designed. For example, in a 1oo1 subsystem, if a single component is not operational, then the system is deemed not operational. In a 1oo2 subsystem, a first component or channel may fail, and a second component or channel may provide redundant operations so that the subsystem continues to operate. Likewise, in a 2oo3 subsystem, a first and a second component have to be in an operational condition for safe operations. In a 4oo4 subsystem, all 4 components have to be operational for the subsystem to operate as designed. Accordingly, the model library may include, for each subsystem or component of the observed process, XooN models, where N may be 1, 2, 3, 4, 5, 6, 7, 8, 9, 10, 100, or more. In this manner, a subsystem may be modeled multiple times, each model providing a different reliability configuration. One model may be a 1oo1 model, another model may be a 1oo2 model, another model may be a 2oo3 model, and so forth. The resulting models, such as models 24, 26, 28, 30, 32, and 34, may then be stored by the model library 22. It is to be noted, that while the model library 22 shows six models, more or less models may be used.

Indeed, for some processes, the model library 22 may store upwards of several thousand models.

The SIS modeling tool 36 may also be used to combine the models 24, 26, 28, 30, 32, and 34 in the model library. For example, the models 24, 26, 28, 30, 32, and 34 may be used as "building block" component models to design a more complex model, as described in more detail below. Advantageously, by providing for component models 24, 26, 28, 30, 32, and 34, which may be combined to build larger models, the SIF 20 may be more quickly and easily analyzed. Indeed, a SIF model focused on a specific reliability configuration and/or equipment may be constructed by using one or more of the pre-existing models 24, 26, 28, 30, 32, and 34 and the SIS modeling tool 36, thus minimizing or eliminating modeling anew.

The models 24, 26, 28, 30, 32, and 34 may be used by a dynamic risk calculation engine (DRCE) 38 to derive performance measures, such as PFD. Advantageously, the DRCE 38 may incorporate input data from the sensors 12, final elements 14, the controller 18, and other systems 16, to update the performance measures. Indeed, the DRCE 38 may continuously update the performance measures based on process conditions (e.g., temperatures, pressures, speed, flow rates, fuel usage, fired hours), unexpected events (trips, outages, load rejections, and/or expected events (e.g., scheduled maintenance, replacements, refurbishments). Accordingly, the DRCE 38 may enable a real-time or near real-time assessment of risk. This risk assessment may then be used to derive certain actions, including commanding the execution of partial or full proof tests, and providing maintenance schedules. The actions may result in a change of the risk, which may then be re-derived by the DRCE 38. Accordingly, the DRCE 38 may provide for a feedback loop suitable for deriving risks and responding with appropriate actions.

Additionally or alternatively, the risks derived by the DRCE 38 may be communicated, for example, to the other systems 16 and/or to other DRCEs 38. For example, maintenance, operational, and/or economic decisions or actions may be made, taking into account the risk derived by the DRCE 38. The decisions may be used to better enhance maintenance, enhance the procurement of parts, minimize insurance costs, enhance the allocation of equipment, the allocation of personnel, and/or improve the training of personnel (e.g., safety training). In a maintenance enhancement example, maintenance activities may be synchronized, maintenance activities may be minimized, and/or equipment downtime may be minimized.

During maintenance synchronization, the risk derived by the DRCE 38 may be used to better synchronize maintenance activities across equipment. For example, replacement of a turbine blade may be synchronized with other activities based on their current risk, such as a shroud inspection, a replacement of turbine cans, a replacement of other blades, and so on. Likewise, minimization of maintenance activities may be provided based on the DRCE 38 risk assessment. For example, a maintenance schedule may be derived that enables equipment to be used up to a maximum desired risk, thus enabling a minimal maintenance schedule that supports the desired risk. Similarly, equipment interruption may be minimized. For example, the continuous operation of a turbine system may be maximized by deriving the risk of continuing operations with equipment as-is.

These risks derived by the DRCE 38 may also enable a multi-plant or multi-facility optimization. For example, processes and equipment in a first plant (e.g., power production plant) may be monitored by a first DRCE 38, while processes and equipment in a second plant may be monitored by a second DRCE 38 communicatively coupled to the first DRCE 38. By deriving risks across plants, decisions may be derived that enhance multi-plant (or multi-facility) operations, maintenance, uptime, and/or economics. For example, a first plant may include equipment that the DRCE 38 may have estimated to be near end-of-life, accordingly, a second plant may be enhanced to provide for added power during the time that the first plant is refurbished. Further details are described with respect to FIG. 7 below.

Figure 2:
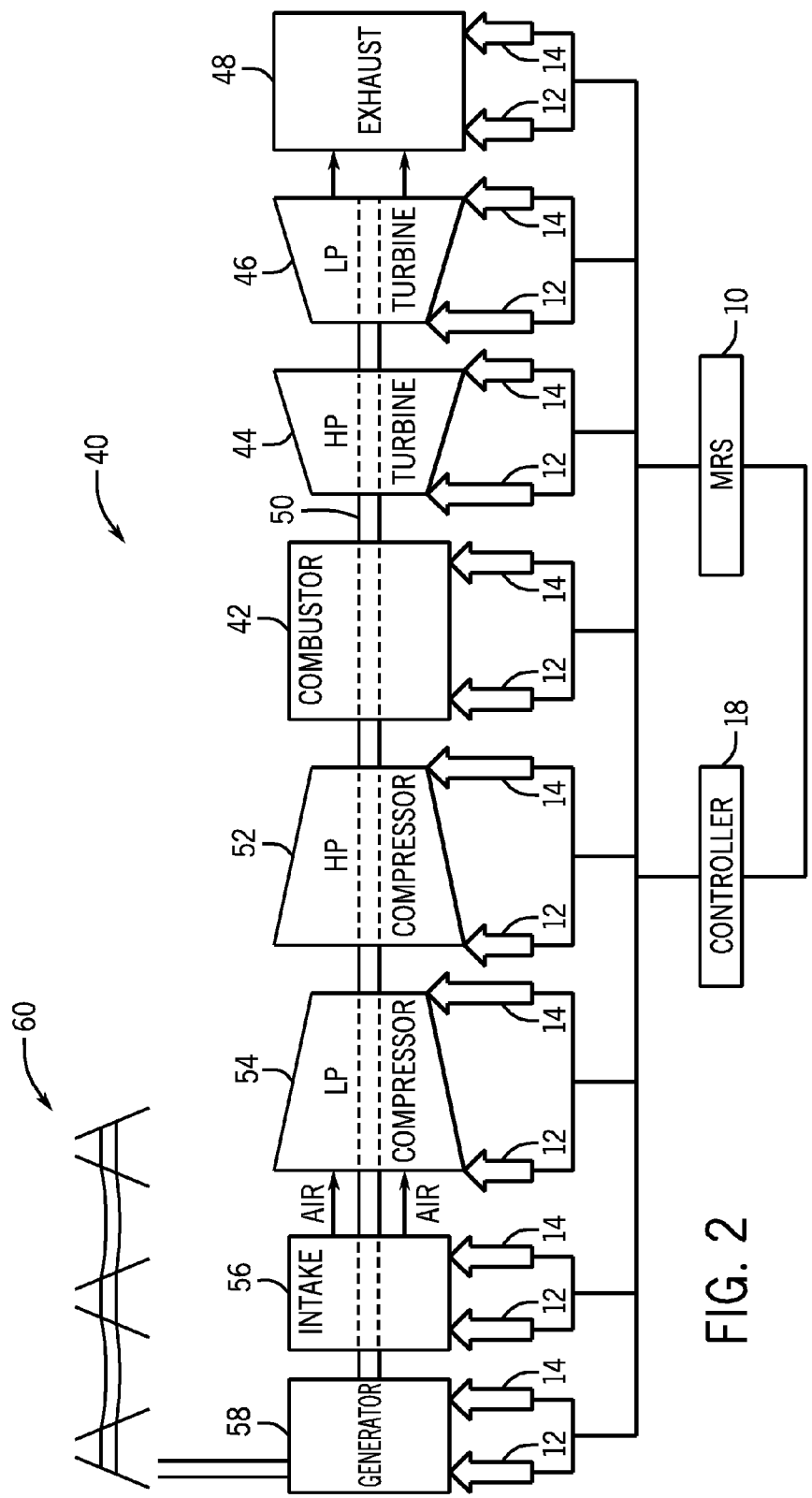
FIG. 2 is a schematic diagram of an embodiment of the MRS of FIG. 1 communicatively coupled to a turbomachinery system.

It may be useful to describe an embodiment of the some example machinery 21 that may be analyzed and/or monitored by the systems and methods described herein, such as a turbine system 40 illustrated in FIG. 2. As depicted, the turbine system 40 may include a combustor 42. The combustor 42 may receive fuel that has been mixed with air for combustion in a chamber within combustor 42. This combustion creates hot pressurized exhaust gases. The combustor 42 directs the exhaust gases through a high pressure (HP) turbine 44 and a low pressure (LP) turbine 46 toward an exhaust outlet 48. The HP turbine 44 may be part of a HP rotor. Similarly, the LP turbine 46 may be part of a LP rotor. As the exhaust gases pass through the HP turbine 44 and the LP turbine 46, the gases force turbine blades to rotate a drive shaft 50 along an axis of the turbine system 40. As illustrated, drive shaft 50 is connected to various components of the turbine system 40, including a HP compressor 52 and a LP compressor 54.

The drive shaft 50 may include one or more shafts that may be, for example, concentrically aligned. The drive shaft 50 may include a shaft connecting the HP turbine 44 to the HP compressor 52 to form a HP rotor. The HP compressor 52 may include blades coupled to the drive shaft 50. Thus, rotation of turbine blades in the HP turbine 44 causes the shaft connecting the HP turbine 44 to the HP compressor 52 to rotate blades within the HP compressor 52. This compresses air in the HP compressor 52. Similarly, the drive shaft 50 includes a shaft connecting the LP turbine 46 to the LP compressor 54 to form a LP rotor. The LP compressor 54 includes blades coupled to the drive shaft 50. Thus, rotation of turbine blades in the LP turbine 46 causes the shaft connecting the LP turbine 46 to the LP compressor 54 to rotate blades within the LP compressor 54. The rotation of blades in the HP compressor 52 and the LP compressor 54 compresses air that is received via an air intake 56. The compressed air is fed to the combustor 42 and mixed with fuel to allow for higher efficiency combustion. Thus, the turbine system 40 may include a dual concentric shafting arrangement, wherein LP turbine 46 is drivingly connected to LP compressor 54 by a first shaft portion of the drive shaft 50, while the HP turbine 44 is similarly drivingly connected to the HP compressor 52 by a second shaft portion of the drive shaft 50 internal and concentric to the first shaft. Shaft 50 may also be connected to an electrical generator 58. The generator 58 may be connected to an electrical distribution grid 60 suitable for distributing the electricity produced by the generator 58.

The turbine system 40 may also include the plurality of sensors 12, configured to monitor a plurality of engine parameters related to the operation and performance of the turbine system 40, as described herein. The turbine system 40 may additionally include the plurality of actuators 14, configured to actuate various equipment of the turbine system 40. The sensors 12 may measure, for example, environmental conditions, such as ambient temperature and ambient pressure, as well as a plurality of engine parameters related to the operation and performance of the turbine system 40, such as, exhaust gas temperature, rotor speed, engine temperature, engine pressure, gas temperature, engine fuel flow, vibration, clearance between rotating and stationary components, compressor discharge pressure, exhaust emissions/pollutants, and turbine exhaust pressure. Further, the sensors 12 may also measure actuator 14 information such as valve position, and a geometry position of variable geometry components (e.g., air inlet). Measurements taken by the sensors 12 may be transmitted to the MRS 10 and the controller 18. Likewise, data from the MRS 10 and the controller 18 may be transmitted to the final elements 14. The transmitted measurements may also be processed as part of the SIF 20 inputs to derive an action, such an overspeed protection action, as described in more detail with respect to FIG. 3.

Figure 3:
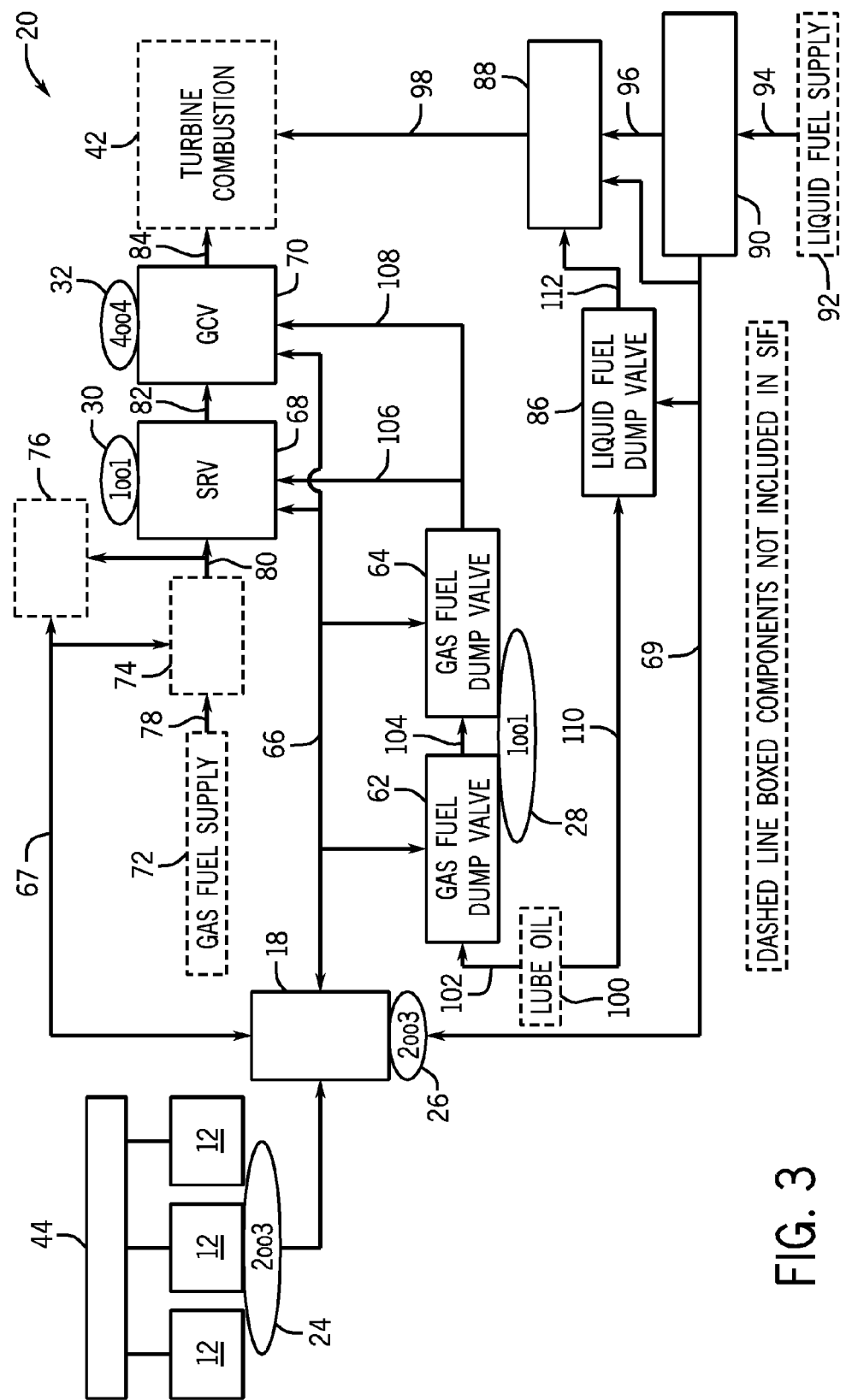
FIG. 3 is a diagram of an embodiment of a safety instrumented function (SIF) including a plurality of component models.

FIG. 3 is a schematic diagram illustrating an embodiment of the SIF 20, where the SIF 20 is depicted as being used to provide for overspeed protection for the turbine system 40 of FIG. 2 when using a gas fuel. For example, during a full load rejection, the power distribution grid 60 may fail to accept power produced by the turbine system 40. Certain systems, such as the SIF 20 overspeed protection system, may then react by reducing turbine load quickly while simultaneously limiting over speed. The turbine system 40 may then be brought to a condition suitable for optimizing synchronization of the turbine system 40 with the power grid 60 once the power grid 60 begins to accept power. The systems and methods disclosed herein may model the SIF 20 by providing, for example, the models 24, 26, 28, 30, and 32, suitable for modeling the specific SIF 20 configuration depicted in FIG. 3. It is to be noted that the techniques described herein may be used to model any safety system, and are not limited to overspeed protection systems.

In the depicted embodiment, a gas turbine, such as the turbine 44, may be monitored by three sensors 12 in a 2oo3 arrangement. That is, the SIF 20 may continue operations as long as 2 out of the 3 sensors 12 remain operational. Accordingly, the model 24 is depicted as including a 2oo3 Markov model 24. Because other configurations may include more or less sensors 12 in different arrangements, the model 24 may be any XooN Markov model. It is to be noted that, while the models 24, 26, 28, 30, and 32 are depicted as a Markov models in FIG. 3, in other embodiments, the model 24, 26, 28, 30, and 32 may additionally or alternatively include a FTA model, a RBD model, a risk graph model, a LOPA model, or a combination thereof.

Data from the sensors 12 may then be transmitted to the controller 18. In the depicted embodiment, the controller 18 may be a single, dual or a triple modular redundant (TMR) controller 18, such as the Mark VIeS controller available from General Electric Co., of Schenectady, N.Y. or any type of controller. The Mark VIeS controller 18, for example, may include 3 redundant controllers in a master-slave arrangement suitable for automating a variety of processes. Accordingly, the model 26 associated with the control logic is depicted as a 2oo3 Markov model. The controller 18 is depicted as communicatively coupled to 2 gas fuel dump valves 62 and 64 through a signal conduit or cabling 66 in a 1oo1 architecture as reflected by the model 28. The controller 18 may also use conduits 67 and 69 to communicate with other depicted devices.

The controller 18 is also communicatively coupled to a stop/speed ratio valve (SRV) 68 and a gas fuel control valve (GCV) 70 useful in controlling turbine operations by controlling pressure and/or fuel flow rates of a gas fuel delivered by a gas fuel supply 72 through a valve 74. A vent valve 76 is also depicted. The gas fuel may be directed through conduits 78, 80, 82, and 84 for combustion at the combustor 42. The SRV 68 includes a 1oo1 architecture, as depicted by the model 30, and the GCV 70 includes a 4oo4 architecture, as depicted by the model 32. Because the turbine system 40 may be a dual fuel system enabling the use of a liquid fuel additional to the gaseous fuel, valves 86, 88 and 90 are depicted, useful for liquid fuel operations when the liquid fuel is provided by a liquid fuel supply 92 through liquid conduits 94, 96, and 98. Lube oil from a lube oil supply 100 may be provided to the valves 62, 64, 68, 70, 86, and 88 through conduits 102, 104, 106, 108, 110, and 112.

Should an overspeed event occur, the SIF 20 may automatically provide overspeed protection by actuating the valves 62, 64, 68, 70, 74, 76, 86, 88, and/or 90. For example, during gas operations, pressures and/or fuel flow rates may be reduced by using the valves 68 and 70 according to certain algorithms suitable for safely lowering turbine speed, thus protecting equipment to equipment, such as turbine blades, from potential damage. The SIF 20 may be provided in different SIL levels of reliability based on the architecture supported by the models 24, 26, 28, 30, 32. Higher SIL levels may result in increased reliability, while lower SIL levels may reduce cost. A tool, such as an embodiment of the SIS modeling tool 36 described in FIG. 4, may be used to more efficiently analyze the SIF 20 to derive a desired SIL configuration.

Further, the DRCE 38 included in the controller 18 may be used to monitor the SIF 20 while in-use to derive a current reliability or a current risk. Advantageously, the models (e.g., models 24, 26, 28, 30, 32 and 34) described herein may enable the inclusion of operational data (valves opening and closing, unscheduled proof tests, scheduled proof tests, fired hours, pressure, fuel utilization, flow rate, speed, temperature) as part of their risk calculations. Accordingly, the DRCE 38 may continuously compute performance measures (e.g., PFD, MTTF, MTBF, SFF, HFT) of the SIF 20 during operations of the machinery 21. The performance measures may then be used to derive a variety of maintenance, operational and economic decisions or actions, including multi-plant or multi-facility decisions, as described in more detail with respect to FIG. 7 below.

Figure 4:
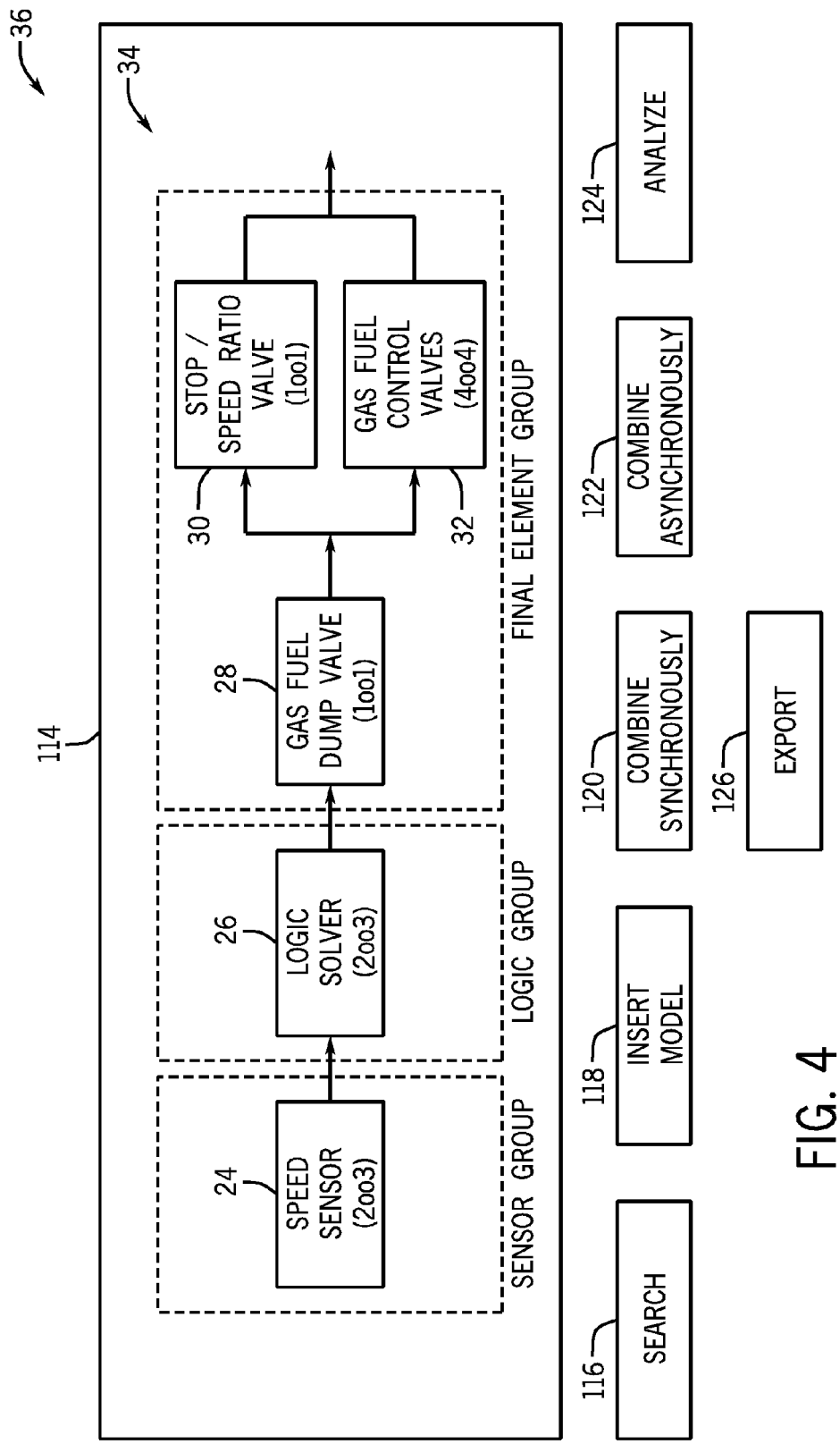
FIG. 4 is a screenshot of an embodiment of a screen of a safety instrumented system (SIS) modeling tool.

Turning now to FIG. 4, the figure depicts an embodiment of a display screen 114 (e.g., graphical user interface) of the SIS modeling tool 36 displaying an embodiment of the model 34. As mentioned above, the SIF 20 may be analyzed by using the model 34. The model 34 may have been constructed by using the SIS modeling tool 36 to combine pre-existing models 24, 26, 28, 30, and 32. Indeed, the SIS modeling tool 36 may provide for modeling services that facilitate the creation and use of all models in the model library 22, such as the depicted models 24, 26, 28, 30, 32, and 34. By more easily building reliability models out of component models, rather than by modeling each SIF anew, the systems and methods described herein may provide for a more efficient modeling that may also result in the minimization or elimination of modeling errors.

In the depicted embodiment, a user, such as a safety analyst or safety engineer, may use a search facility 116 (e.g., software search tool) to locate pre-existing model or models, such as the models 24, 26, 28, 30, and 32. The search facility may use a database (e.g., relational database, network database, file system) to list models by model type (e.g., Markov, FTA, RBD, risk graphs, and/or LOPA), by equipment (e.g., overspeed equipment, turbine equipment, safety-related equipment), by reliability architecture (e.g., XooN), and so on. The "found" models may then be inserted into the display for the screen 114, for example, by using an insert facility 118 (e.g., software insert tool).

The inserted models 24, 26, 28, 30 and 32 may then be combined into a larger model 34, for example, by using the combine facilities 120 and 122 (e.g., software tools). In the depicted embodiment, the component models 24, 26, and 28 may be combined synchronously (i.e., in series), and the models 30 and 32 may be combined asynchronously (i.e., in parallel). For example, the model 24 relating to the speed sensors 12 may be combined synchronously with the model 26 relating to the logic solver (e.g., controller 18) and the model 28 related to the gas fuel dump valve (e.g., valves 62, 64) by using the synchronous combination facility 120. Likewise, the model 30 may be combined asynchronously with the model 32 by using the asynchronous combination facility 122 (e.g., analysis software tool).

Additionally, the tool 36 may be used to select one or more of the models 24, 26, 28, 30, and 32 as first, second, and third element group of the SIF 20. For example, the model 24 may be selected as the first group (e.g., sensor group), the model 26 may be selected as the second group (e.g., logic solver group), and the models 28, 30, and 32 may be selected as the third group (e.g., actuator group), of the SIF 20. The combination of the models 24, 26, 28, 30, and 32 may then result in the combined model 34.

The user may then analyze the model 34 created by combining the component models 24, 26, 28, 30, and 32 by using, for example, an analyze facility 124. The analyze facility 124 may derive overall performance measurements for the newly created model 34 by using the pre-existing models 24, 26, 28, 30, and 32. Some example performance measures that may be automatically derived include but are not limited to reliability, PFD, and RRF.

Reliability $R_{SIF}(t)$ for the SIF 20 (e.g., model 34) may be calculated by using the equation:

$$R_{SIF}(t) = R_{SpeedSensors}^{2oo3}(t) \times R_{Solver}^{2oo3}(t) \times R_{FinalElementGroup}^{2oo2}(t)$$

The probability of failure on demand for the SIF 20 $PFD_{SIF}(t)$ may be calculated by using the equation:

$$PFD_{SIF}(t) = 1 - R_{SIF}(t)$$

The risk reduction factor RRF for the SIF 20 may be calculated by using the equation:

$$RRF = \frac{1}{PFD_{AvgSIF}}$$

The average probability of failure on demand $PFD_{AvgSIF}$ may be calculate as follows:

$$PFD_{AvgSIF} = \frac{1}{T} \int_0^T PFD_{SIF}(\tau) d\tau$$

Accordingly, the $PFD_{AvgSIF}$ provides for an overall PFD for the entire SIF 20, including all individual subsystems of the SIF 20. By providing for techniques useful in searching, combining, and analyzing the component models 24, 26, 28, 30, 32, and 34 included in the model library 22, the systems and methods described herein may enable the reuse of the component models 24, 26, 28, 30, and 32. By reusing, documented, substantially error-free component models from the library 22, any number of SIF designs may be analyzed and constructed in a more efficient manner. An export facility 126 may then be used to export the model 34 for use by, for example, the DRCE 38.

Figure 5:
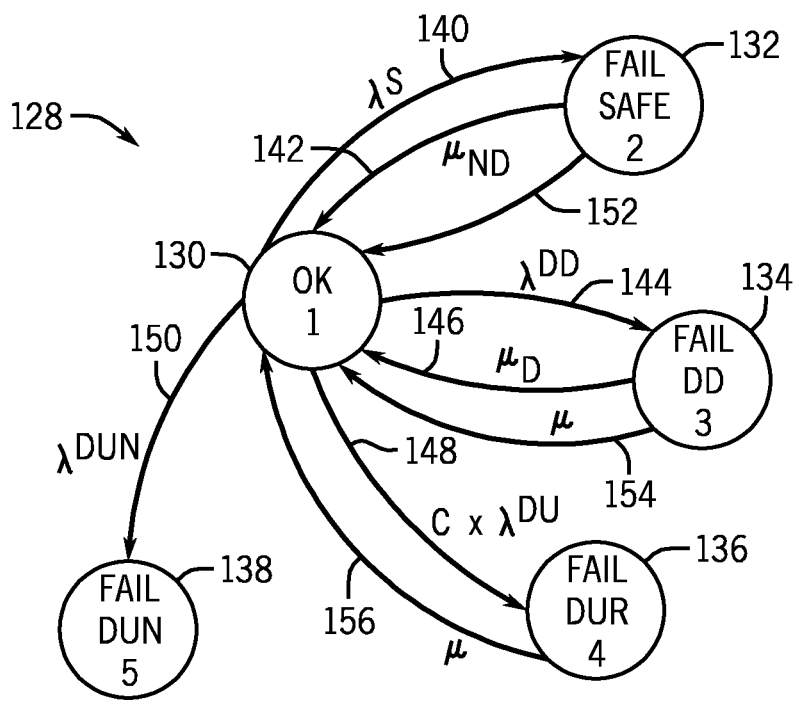
FIG. 5 is a block diagram of an embodiment of a Markov model suitable for modeling a safety system.

It may be beneficial to describe certain model types, such as a Markov model embodiment depicted in FIG. 5. More specifically, FIG. 5 depicts a 1oo1 Markov model 128 suitable for use in reliability analysis, for example, included in the component models 28 and/or 30 having a 1oo1 architecture. The model 128 may also be applicable to 4oo4 architectures. As mentioned previously, Markov models may be particularly apt for reliability models because state and state transitions may be more easily defined and visualized. Additionally, the Markov models described herein account for time dependency, thus enabling a time-based derivation of performance measures such as PFD. Further, the Markov model may be used to incorporate certain actions, such as proof tests, suitable for transitioning between states.

In the depicted embodiment, the Markov model 128 includes a list of possible states 130, 132, 134, 136, and 138 for the system, possible transition paths 140, 142, 144, 146, 148, 150, 152, 154, and 156 between the states 130, 132, 134, 136, and 138, and rate parameters for the transitions $\lambda^S$, $\mu_{SSD}$, $\lambda^{DD}$, $\mu_O$, $C \times \lambda^{DU}$, $\lambda^{DUN}$. The state 130 (e.g., Ok state) denotes a system in a known healthy state. The state 132 (e.g., Fail Safe) denotes a state in which the system has failed in a safe manner. The state 134 (e.g., Fail DD) denotes a state in which the system has failed dangerously but the failure is detected. The state 136 (e.g., Fail DUR) denotes a state in which the system has failed in an undetected condition, but is repairable, while the state 138 (e.g., Fail DUN) denotes a state in which the system has failed undetected and is not repairable.

The system may move from state to state via the state transitions 140, 142, 144, 146, 148, 150, 152, 154, and 156. If the system is in one state at a point in time, the probability of the system remaining in the same state will decrease based on rates of transition $\lambda^S$, $\mu_{SSD}$, $\lambda^{DD}$, $\mu_O$, $C \times \lambda^{DU}$, $\lambda^{DUN}$ depicted for their respective state transition. At some time, the system may transition from one state into another state. The lambda (i.e., $\lambda$) transitions are generally based on failure rates, while the mu (i.e., $\mu$) transitions are generally based on repair rates. In one embodiment, the lambda and mu rates are based on empirical data, such as a fleet-wide data (e.g., turbine fleet data) detailing failure and repair rates. Additionally or alternatively, the lambda and mu rates may be based on theoretical analysis, such as low cycle fatigue (LCF) life prediction models, computational fluid dynamics (CFD) models, finite element analysis (FEA) models, solid models (e.g., parametric and non-parametric modeling), and/or 3-dimension to 2-dimension FEA mapping models that may be used to predict the risk of equipment malfunction and/or the rate of repairs.

The rate of transitioning from the state 130 to the state 132 is depicted as $\lambda^S$ (e.g., safe failure rate), while the rate of transitioning from the state 130 to the state 134 is depicted as $\lambda^{DD}$ (e.g., dangerous detected failure rate). Likewise, the rate of transitioning from the state 130 to the state 136 is depicted as $C \times \lambda^{DU}$ (e.g., undetected failure rate with coverage), while the rate of transitioning from the state 130 to the state 138 is depicted as $\lambda^{DUN}$ (e.g., undetected failure rate without repair).

In the depicted embodiment, a probability distribution vector $S_k$ of the states 130, 132, 134, 136, and 138 may be derived by the equation:

$S_k = [p_{1k}\ p_{2k}\ p_{3k}\ p_{4k}\ p_{5k}]$ where $p_n$ denotes the probability of the system being at state n. The states' probability propagation in between events may then be found by the equation:

$S_{k+1} = S_k \times e^{A\alpha t}$ where A is related to the appropriate failure and repair rates lambda and mu respectively. Additionally, the Markov model 128 may be used to derive n-time steps. That is, the reliability of the modeled system may be simulated, such that n future steps may be predicted, each step having associated reliability and reliability and performance measures (e.g., $R_{SIF}(n)$, $PFD_{SIF}(n)$, $PFD_{AvgSIF}(n)$). In one embodiment, a derivation of the Chapman-Kolmogorov equation may be used to calculate the n-time reliability and performance measures. For example, the probability of going from a state i to a state j in n-time steps may be calculated by using the equation:

$p_{ij}^{(n)} = \Pr(X_{k+n}=j|X_k=i)$ where the marginal distribution $\Pr(X_n=x)$ is the distribution over the states 130, 132, 134, 136, and 138 at time n. By using the calculated probabilities, the Markov model 128 may be used to predict one or more performance measures (e.g., $R_{SIF}(n)$, $PFD_{SIF}(n)$, $PFD_{AvgSIF}(n)$). The predictions may then be used to derive certain actions, such as maintenance actions (e.g., online diagnosis, output diagnosis, proof test scheduling, full refurbishment), economic actions, and/or plant operation actions. For example, a proof test (e.g., partial proof test, full proof test) may be commanded based on the predictions. The results of the proof test, alarms, or other events (e.g., maintenance actions) may then be used to update the model 128. For example, a successful proof test may result in the model returning to the Ok state 130 via state transitions 152, 154, or 156. Indeed, the Markov model 128 may be used to enable the execution of a proof test, and the results of the proof test may then be used to update the model 128. By providing for decisions (e.g., proof tests, alarms, events) useful in evaluating the SIF 20, the reliability of the SIF 20 may be substantially improved. Additionally or alternatively, the model 128 may be used for online diagnosis, such that failures of the SIF 20 may be detected and corrected, output diagnosis, such that subsystems of the turbine system 10 may be driven to a safe condition if a failure is detected, proof test scheduling as described below with respect to FIG. 6, and/or full refurbishment, such that the SIF 20 (and/or turbine 10 subsystems) may be brought back to a "as new" condition.

Figure 6:
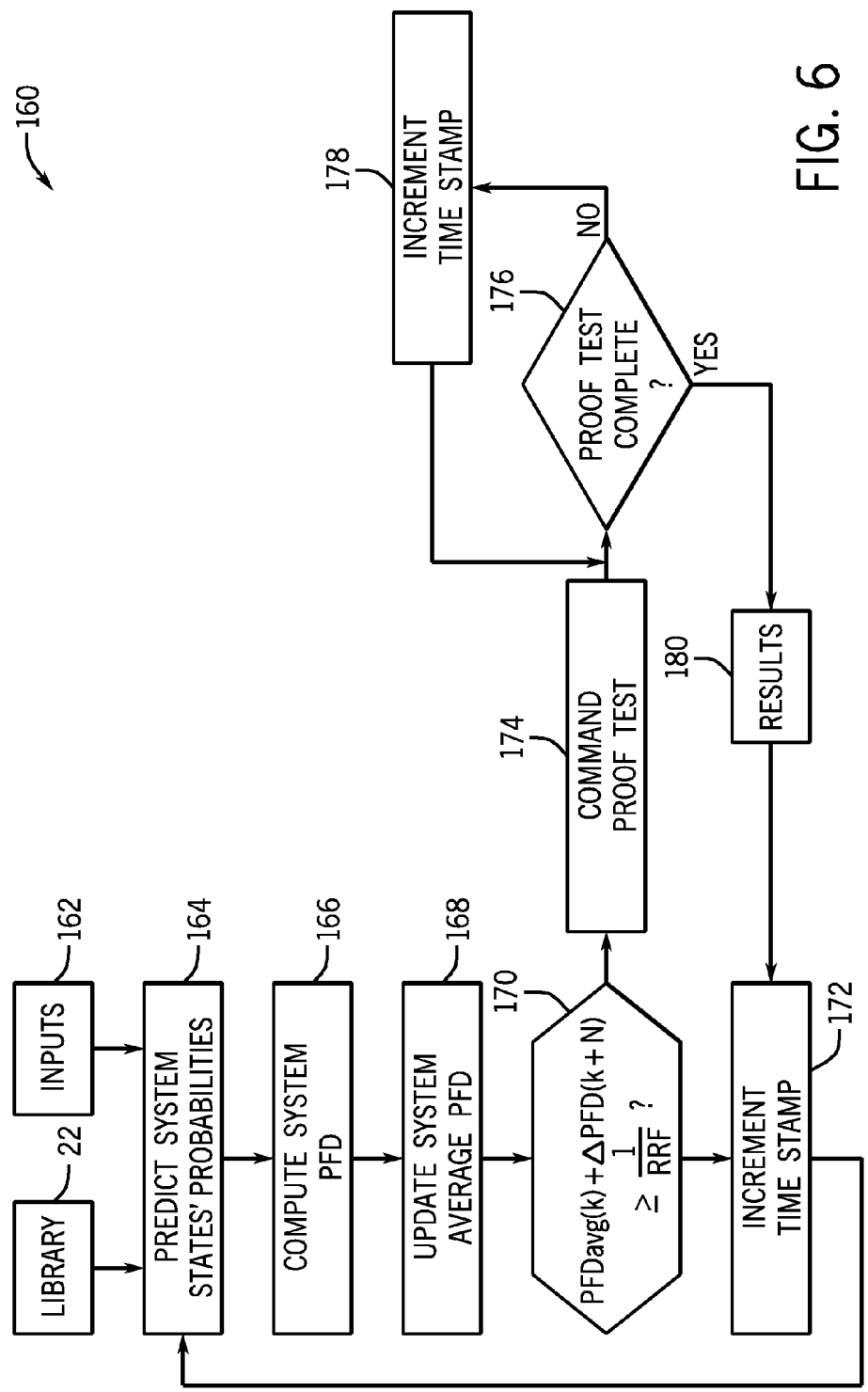
FIG. 6 is a flowchart of an embodiment of a process useful in deriving a more efficient proof test interval.

Turning to FIG. 6, the figure depicts a process 160 that may be used to compute performance measures and/or reliability measures based on the techniques described herein, and to derive certain actions (e.g., proof test actions) based on the computations. The process 160 may be implemented as code or computer instructions stored in non-transitory machine readable media and executed, for example, by the controller 18.

In the depicted embodiment, the DRCE 38 may use the models 24, 26, 28, 30, 32, and/or 34 included in the model library 22, in addition to other inputs 162, to predict a system's states' probabilities (block 164), such as the probabilities included in the probability distribution vector $S_k$ described above. The inputs 162 may include fault tolerance inputs (e.g., RRF), maintenance policy inputs (e.g., online diagnosis input, output diagnosis input, proof test model input, full refurbishment input), and sensor 12 inputs and other systems 16 inputs. In one example, $S_k$ and related probabilities may be found by using Markov modeling techniques and/or other modeling techniques (e.g., FTA, RBD, risk graphs, LOPA). In one embodiment, the process 160 may then compute the system PFD (block 166) by using the equation:

$$PFD_{SIF}(t) = 1 - R_{SIF}(t).$$

The process 168 may then update the system average PFD $PFD_{AvgSIF}$ (block 168) based on the derived PFD (block 166). For example, the equation:

$$PFD_{AvgSIF} = \frac{1}{T}\int_0^T PFD_{SIF}(\tau)d\tau$$

may be used.

By deriving $PFD_{AvgSIF}$, the process 160 enables the derivation of the overall PFD for the system under analysis (e.g., SIF 20). Indeed, the overall PFD for a system, such as the SIF 20, may be automatically derived, for example, by the DRCE 38 which may be included in the controller 18. Other performance measures may be similarly derived, included but not limited to MTTF, MTBF, SFF, and/or HFT.

The process 160 may then determine (decision 170) if the $PFD_{AvgSIF}$ summed to a N-step change (e.g., $\alpha PFD(k+N)$) is greater than 1/RRF, where RRF may be input by the user or system operator. By providing for the RRF input, the process 160 may enable the use of a variety of reliabilities, as desired by the user or system operator. That is, the decision 170 may used to determine if the system is performing within a desired reliability range (e.g., within a desired RRF). If the system is performing as desired (decision 170), then the system may increment a time stamp (block 172) and loop back to the block 164 for further processing as described above. If the system is performing outside of a desire reliability range, then the process 160 may command the execution of an action (block 174), such as a proof test action. For example, the system may command that a valve be opened. The proof test may be automatically executed, or may be executed by human intervention after prompting.

The process 160 may then wait on the result of the action (decision 176), such as the completion of the proof test. If the proof test is not complete, then the process 160 may increment a time stamp (block 178) and iterate back to the decision 176. Once the proof test is complete, the results of the proof test (block 180) may be used as additional inputs to the process 160. For example, input data (block 180), such as field device data, may be used to determine the performance of equipment used in the proof test. The process may then increment a time stamp (block 172) and iterate back to block 164 for further processing. Advantageously, the process 160 may derive a proof test interval schedule that more efficiently enables equipment maintenance and utilization based on a desired RRF. In one example, a maintenance schedule (e.g., proof test schedule) may be derived that minimizes equipment replacement based on a desired RRF. Additional or alternative to maintenance actions, operational and/or economic actions may also be derived based on the calculated performance measures, as described in more detail below with respect to FIG. 7.

Figure 7:
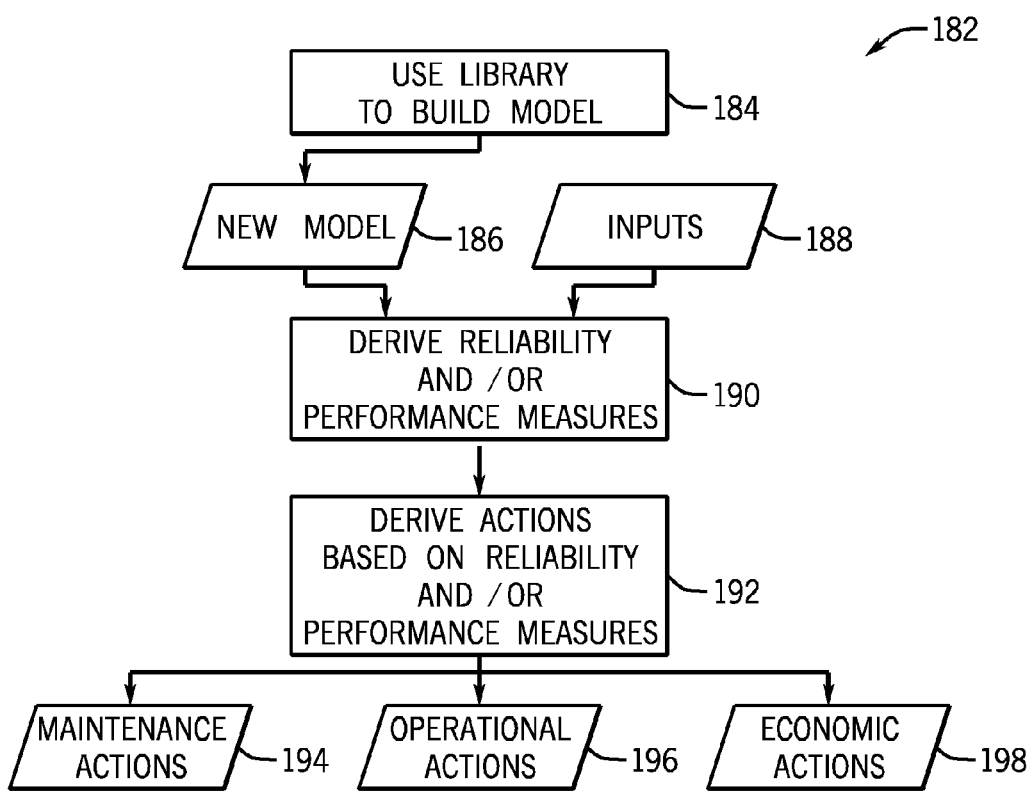
FIG. 7 is a flowchart of an embodiment of a process useful in deriving maintenance actions, operational actions, and/or economic actions, based on calculated risk.

FIG. 7 depicts an embodiment of a process 182 that may use the systems and methods described herein to derive certain maintenance actions, operational actions, and/or economic actions, based on calculated performance measures (e.g., PFD, MTTF, MTBF, SFF, HFT) that may have been derived by using the model library 22. The process 182 may be implemented as code or computer instructions stored in non-transitory machine readable media executed, for example, by the controller 18. In the depicted embodiment, the process 182 may use the model library 22 to build a model (block 184), such as the model 34 suitable for analyzing the performance measures and reliability of a system of interest, such as the SIF 20. By reusing the component models in the model library 22 rather than building a model anew, substantial time savings may be achieved. Indeed, by reusing previously constructed models significant time savings may be enabled. Further, because the models of the model library 22 may have been error check more extensively and used multiple times, modeling errors may be minimized or eliminated.

The new model 186 may then be used, for example, with inputs 188, to derive reliability and/or performance measures (block 190). The inputs 188 may include fault tolerance inputs (e.g., RRF), maintenance policy inputs (e.g., online diagnosis input, output diagnosis input, proof test model input, full refurbishment input), and sensor 12 inputs and other systems 16 inputs. Techniques, including but not limited to Markov modeling, RBD, risk graphs, LOPA, or a combination thereof, may then be used to derive the reliability and/or performance measures (e.g., PFD, MTTF, MTBF, SFF, HFT). In the depicted embodiments, the derived reliability and/or performance measures (block 190) may then be used as inputs to optimization systems, including maintenance optimization systems, operational optimization systems, and/or economic optimization systems. These aforementioned systems may then derive certain actions (block 192) based on the reliability and/or performance measures. For example, maintenance actions 194, operational actions 196, and/or economic actions 198 may be derived (block 192).

Maintenance actions 194 may include the following: 1) The derivation of a more efficient proof test schedule that may minimize a time interval between proof tests but also maintain a desired reliability measure (e.g., RRF). 2) The derivation of a synchronized maintenance schedule suitable for synchronizing, for example, the maintenance of the SIF 20 with the maintenance of other subsystems of the system 10. By synchronizing maintenance of various systems with the SIF 20, the utilization of resources may be improved while reducing time and cost. 3) The derivation of a bill of materials (BOM) list of parts ordered by likelihood of replacement. For example, components of the SIF 20 having a higher probability of replacement may be listed in the BOM, in order of probability of replacement, replacement cost, time to procure, supplier availability, criticality (e.g., fault tree criticality), and so on. 4) The incorporation of the reliability and/or performance measures for use as input data by another system, such as an asset management system (e.g., IBM Maximo available from IBM Co., of Armonk, N.Y.). The asset management system may then use the input data to track and manage SIF 20 assets across the enterprise. For example, equipment condition assessment reports and correlative maintenance directives may be issued by the asset management system. 5) The derivation of maintenance actions across multiple sites. For example, power grid 60 maintenance decisions may be more optimally derived by using reliability and/or performance measure across various sites.

Operational actions 196 may include using the reliability and/or performance measures to drive certain equipment. Indeed, by providing for real-time (or near real-time) reliability and/or performance measures, the plant operator may make operational decisions. For example, due to weather conditions (e.g., heat wave, blizzard), the plant operator may weigh the benefits of continuing operations past desired fired hours based on the predicted risk and/or performance measures, and decide to continue operations. Likewise, the unexpected shutdown of a neighboring power plant may result in continuing operations past desired fired hours, after a review of the predicted reliability and/or performance measures. Operational actions 196 may also include dispatching actions. For example, determining the output of a number of power plants may include risk related information. Accordingly, power plants with higher risk may be given lower precedence (or not dispatched), while power plants with lower risks may take a higher precedence.

Economic actions may also be derived. For example, current reliability and/or performance measures may aid in actuarial derivations of plant risk. Indeed, by providing for updated risk assessments, insurance costs may be more accurately derived, including derivations that apply to specific locations and plant operators, rather than generic costs that apply to all equipment of the same type. Likewise, plant recapitalization decisions may be improved by using current reliability and/or performance measures. For example, higher risk systems may be determined to be better candidates for replacement, when compared to systems having less risk. Likewise, economic conditions may be used, in conjunction with the predicted risk, to derive operational decisions. For example, higher market values for power may result in decisions to operate equipment longer than desired, while lower market values for power may result in decisions to operate equipment less than desired. Similarly, spikes in cap and trade markets and "green" credit markets may result in operating decisions to increase or lower equipment utilization. Regulatory system information may also be used with the techniques described herein. For example, emission control systems may be better complied with based on predicted risk. Higher levels of risk in pollution control systems may result in the plant operator or owner adding backup systems and/or changing refurbishment schedules. By deriving maintenance, operational, and/or economic actions 198, the techniques described herein may improve safety operations, plant efficiency, and reduce cost.

Figure 8:
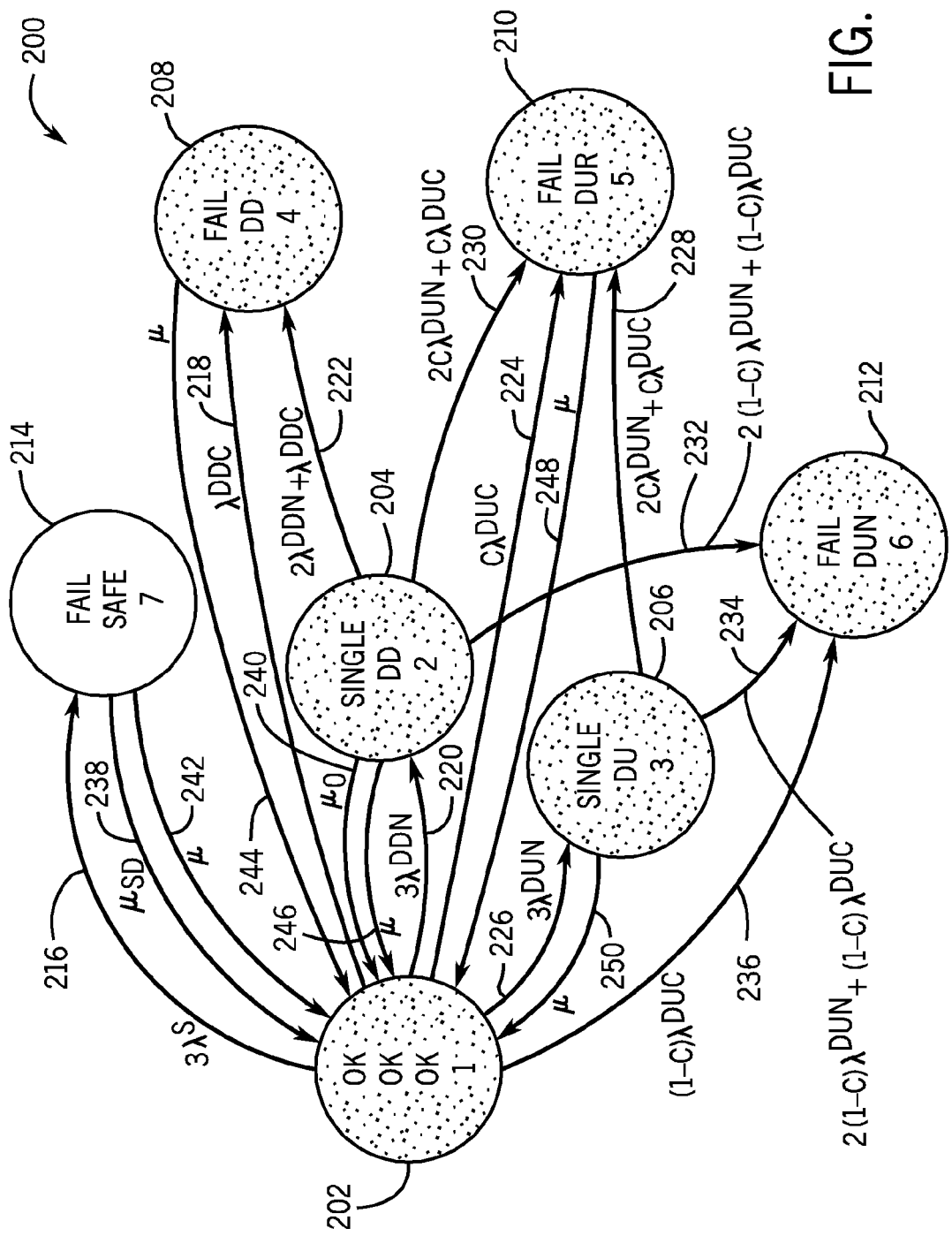
FIG. 8 is a block diagram of an embodiment of a Markov model suitable for modeling a safety system.

FIG. 8 is block diagram an embodiment of a 2oo3 Markov model 200 that may be used by the systems and methods described herein to provide for analysis, such as reliability analysis included in the component models 24 and/or 26 where two out of three components should remain operational for the system to continue operations. In the depicted embodiment, the states 202, 204, 206, 208, 210, 212, and 214 are provided. The state 202 may denote that all modeled components are operational (e.g., ok). The state 204 may denote that a single component failed due to a dangerous but detected failure mode, resulting in degraded operations. The state 206 may denote that a single component failed due to a dangerous but undetected failure mode, resulting in degraded operations. The state 208 may denote that at least two components failed due to a dangerous but detected failure mode, with a likely system failure instead of a degraded operation. The state 210 may denote that at least two components have failed due to a dangerous but undetected failure mode, and that the system may fail instead of operate in a degraded mode. However, the techniques disclosed herein may detect such a mode and, for example, by using a proof test to repair and continue operations. The state 212 may denote at least two components failing due to an undetected failure, and thus the system may fail. A proof test may not be able to repair the system. The state 214 may denote a fail safe, such as a spurious trip or shutdown.

As mentioned above with respect to FIG. 5, lambda (i.e., $\lambda$) and mu (i.e., $\mu$) may be used as failure and repair rates, respectively. Accordingly, a transition 216 from the state 202 to the state 214 may include a $3\lambda^S$ transition rate where $\lambda^S$ represents the safe failure rate. A transition 218 from the state 202 to the state 208 may include $\lambda^{DDC}$ transition rate (e.g., dangerous detected common cause failure rate). A transition 220 from the state 202 to the state 204 may include a $3\lambda^{DDN}$ transition where $\lambda^{DDN}$ is a dangerous detected normal failure rate. Likewise, a transition 222 from the state 204 to the state 208 may include a $2\lambda^{DDN}+\lambda^{DDC}$ failure rate. A transition 224 from the state 202 to the state 210 may include a $C\lambda^{DUC}$ failure rate where $\lambda^{DUC}$ is a dangerous undetected common cause failure rate, and C is coverage. A transition 226 from the state 202 to the state 206 may include a $3\lambda^{DUN}$ failure rate where $\lambda^{DUN}$ is a dangerous undetected normal failure rate.

A transition 228 from the state 206 to the state 210 may also be provided, and include a $2C\lambda^{DUN}+C\lambda^{DUC}$ transition failure rate. A transition 230 from the state 204 to the state 210 may also include the $2C\lambda^{DUN}+C\lambda^{DUC}$ transition failure rate. A transition 232 from the state 204 to the state 212 may include a $2(1-C)\lambda^{DUN}+(1-C)\lambda^{DUC}$ transition rate. Likewise, a transition 234 from the state 206 to the state 212 may include the $2(1-C)\lambda^{DUN}+(1-C)\lambda^{DUC}$ transition rate. A transition 236 from the state 202 to the state 212 may include a $(1-C)\lambda^{DUC}$ transition rate. Accordingly, the depicted model 200 may use the depicted transitions during the N-step analysis to simulate, for example state probability distributions.

Also depicted are repair transitions 238 and 240. For example, the transition 238 includes a $\mu_{SD}$ transition rate (e.g., repair rate of safe detected failure assuming system shutdown and restart). Likewise, the transition 240 includes a $\mu_O$ transition rate (e.g., online repair rate of dangerous detected failure without system shutdown, such as during diagnosis). Transitions 242, 244, 246, 248, 250 related to other repairs, such as proof tests, are also depicted. Indeed, by commanding a proof test, the model may transition through the transitions 242, 244, 246, 248, and/or 250 to the ok state 202 and continue operations. By providing the model 200, an automated analysis of 2-out of -3 component failures may be included, for example, in the DRCE 38.

Figure 9:
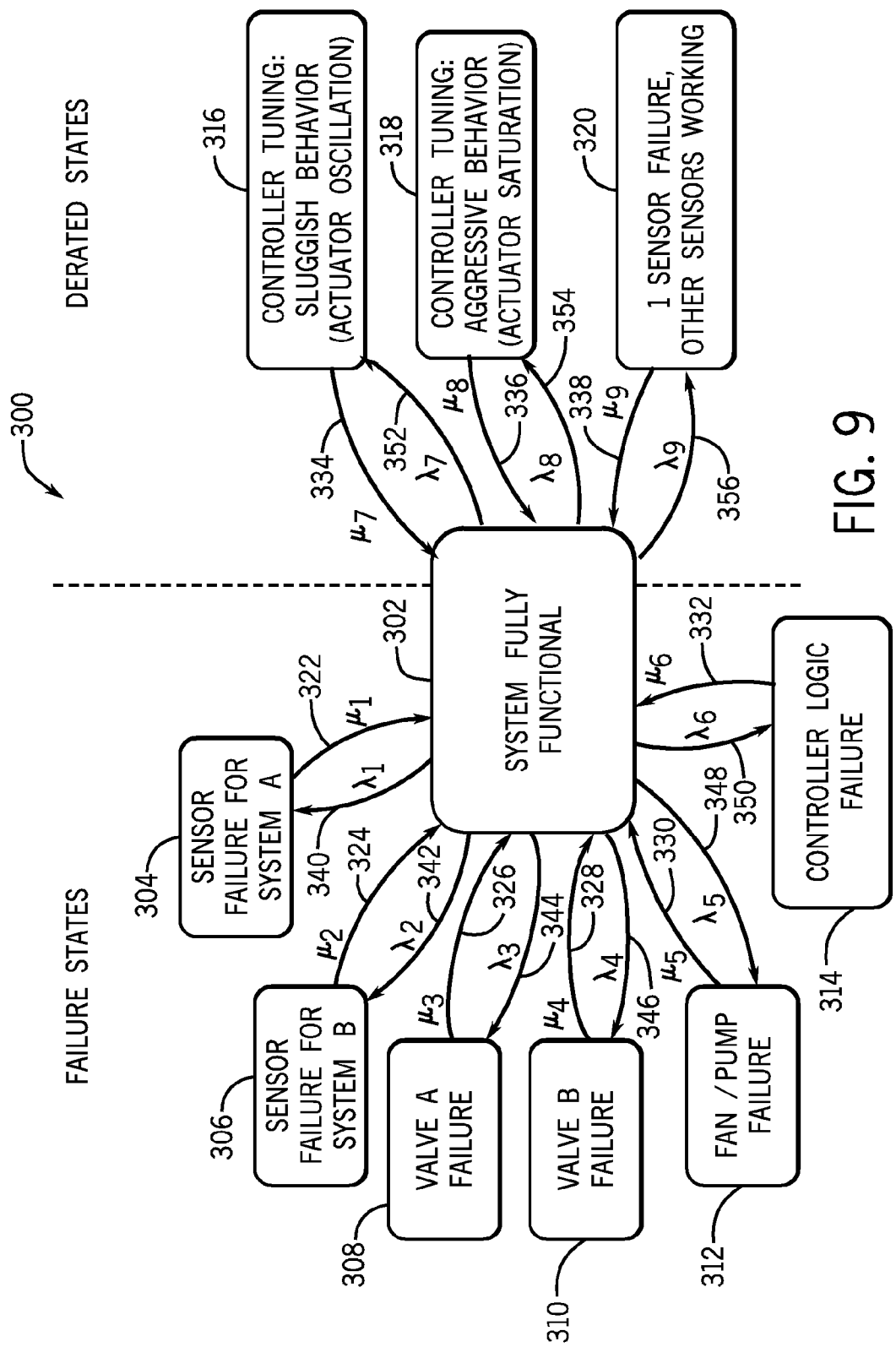
FIG. 9 is a block diagram of a Markov model suitable for modeling a generic system.

In addition to or alternative to modeling SIFs, the techniques described herein may be used to describe any system, including turbomachinery systems. FIG. 9 is block diagram an embodiment of an X-out-of-N Markov model 300 that may be used by the systems and methods described herein to provide for analysis, such as reliability analysis for any component, for example, the machinery 21 or any component or subsystem of the machinery 21. The model 300 may be stored, for example, in the model library 22 shown in FIG. 1, and used to provide reliability analysis, an may be used by the DRCE 38 to dynamically calculate risk for the component modeled by the model 300. Additionally or alternatively, by using the model 300 as an example model, other derivative models may be built, suitable for modeling any component or system. In one example, the model 300 and/or derivative models may be created by using the model library 22 as the new model 86 as described above with respect to FIG. 7, and used to derive maintenance actions 194, operational actions 196, and/or economic actions 198.

In the depicted embodiment, states 302, 304, 306, 308, 310, 312, 314, 316, 318, and 320 are provided. The state 302 may denote that the modeled component or system is operational (e.g., ok state) and that the modeled component or system is functional. States 304 and 306 may be used for sensor conditions. For example, the state 304 may denote that one or more sensors of a system 'A' (e.g., a first subsystem of the modeled component or system) is in an inoperative condition. Likewise, the state 306 may denote that one or more sensors of a system 'B' (e.g., a second subsystem of the modeled component or system) is in an inoperative condition.

States 308, 310, and 312 may be used for actuator and/or other system conditions. For example, state 308 may be used to denote that a valve 'A' is in an inoperative condition, and state 310 may be used to denote that a valve 'B' is in an inoperative condition. Likewise, state 312 may be used to denote that a fan, a pump, a compressor, or other turbomachinery may be in an inoperative condition. Any component or system may be modeled, including software conditions. For example, state 314 may be used to denote that the controller logic or software is inoperative.

States 316, 318, and 320 may be used for modeling derated conditions. That is, states 316, 318, and 320 may model conditions where the system still operates, albeit in a degraded form or with degraded functionality. For example, state 316 may model tuning the controller 18 to react to sluggish behavior (e.g., lagging times to set points), such as during oscillating actuators. Likewise, state 318 may model tuning the controller 18 to react to aggressive behavior (e.g., large overshoot of control set points), such as during actuator saturation. Additionally or alternatively, the derated states may include the state 320 where only a single sensor is inoperative but other sensors are functioning.

As mentioned above with respect to FIG. 5, lambda (i.e., $\lambda$) and mu (i.e., $\mu$) may be used as failure and repair rates, respectively. Accordingly, multiple transitions 322, 324, 326, 328, 330, 332, 334, 336, and 338 (e.g., repair rate transitions) may be provided, having repair rates $\mu_1, \mu_2, \mu_3, \mu_4, \mu_5, \mu_6, \mu_7, \mu_8$, and $\mu_9$, respectively. Likewise, multiple transitions 340, 342, 344, 346, 348, 350, 352, 354, and 356 (e.g., failure rate transitions) may be provided, having failure rates $\lambda_1, \lambda_2, \lambda_3, \lambda_4, \lambda_5, \lambda_6, \lambda_7, \lambda_8$, and $\lambda_9$, respectively. By modeling the transitions 322, 324, 326, 328, 330, 332, 334, 336, 338, 340, 342, 344, 346, 348, 350, 352, 354, and 356, the model 300 may enable a more accurate model of dynamic risk and reliability during operations of the modeled component or system. Indeed, the DRCE 38 may receive inputs as described herein to dynamically model the depicted transition rates and states of the model 300, thus more accurately modeling the risk of a system during operations of the system, or during a simulation of the system operations.

Technical effects of the invention include providing for a model library including a plurality of component models suitable for modeling a variety of safety systems. The models may be combined into a larger model suitable for analyzing a variety of safety instrumented functions (SIFs) and/or any components and systems, including turbomachinery components and systems. The models may use certain inputs (e.g., online diagnosis input, output diagnosis input, proof test input, full refurbishment input), to derive certain actions including maintenance actions. Operational and/or economic actions may also be derived. The models may include techniques such as Markov modeling, Fault Tree Analysis (FTA), reliability block diagrams (RBDs), risk graphs, and/or layer of protection analysis (LOPA) to analyze the SIFs and to derive the reliability and/or performance measures, such as a probability of failure on demand (PFD), mean time to failure (MTTF), mean time between failure (MTBF), safe failure fraction (SFF), hardware failure tolerance (HFT), and/or a risk reduction factor (RRF).

In one process embodiment, the RRF may be given as a desired goal, and the process may use N-step predictive techniques to progressively derive future reliability measures that meet the desired RRF. Accordingly, a more optimal proof test schedule may be derived, suitable for meeting the desired RRF. A process is also provided, suitable for using the model library to derive a variety of maintenance, operational, and/or economic actions.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system comprising:
   a processor communicatively coupled to a memory;

a model library stored in the memory and configured to model a safety system, wherein the model library comprises a plurality of subsystem models, and each of the plurality of subsystem models is configured to derive a reliability measure;

a fault tolerance input;

a maintenance policy input; and a dynamic risk calculation engine (DRCE) configured to be executed by the processor and configured to:

use a user-defined set of the plurality of subsystem models, the fault tolerance input, and the maintenance policy input, to derive a system risk for an apparatus, wherein the system risk comprises an average probability of failure on demand (PFD);

determine if an N-step ahead estimate of the average PFD exceeds a risk reduction factor (RRF), and if the N-step ahead estimate exceeds the RRF, then to command a proof test.

2. The system of claim 1, wherein each of the plurality of subsystem models comprises an X-out-of-N (XooN) Markov model configured to use a plurality of states and state transitions to model the reliability measure.

3. The system of claim 1, wherein the fault tolerance input comprises a risk reduction factor (RRF), and the system comprises a turbomachinery, a safety system, or a combination thereof.

4. The system of claim 1, wherein the maintenance policy input comprises an online diagnosis input, an output diagnosis input, a proof test model input, a full refurbishment input, or a combination thereof.

5. The system of claim 1, wherein the proof test is configured to automatically actuate a valve, a backup system, an apparatus component, or a combination thereof.

6. The system of claim 1, wherein the proof test comprises a partial proof test or a full proof test.

7. The system of claim 1, wherein the DRCE is configured to monitor the proof test to update the system risk.

8. The system of claim 1, wherein the DRCE is configured to use an alarm, a partial proof test, a full proof test, an operational event, a maintenance event, or a combination thereof, to derive a reliability credit, and wherein the reliability credit is used to update the system risk.

9. The system of claim 1, wherein the apparatus comprises a gas turbine system, a steam turbine system, a wind turbine system, a nuclear reactor system, a combustion engine, an electric motor, a pneumatic motor, a hydraulic engine, a device, or a combination thereof.

10. The system of claim 1, wherein the system risk is configured to be provided as input to an optimization system for the derivation of a maintenance action, an operational action, an economic action, an environmental action, or a combination thereof.

11. A method comprising:

using, via a processor, a model library to build a risk model;

deriving, via the processor, a reliability measure based on the risk model and on an input;

deriving, via the processor, an action based on the reliability measure and on a system risk, wherein the risk model comprises at least one failure state, one okay state, at least one derated state, at least one repair rate transition, and at least one failure rate transition, wherein the system risk comprises an average probability of failure on demand (PFD) and wherein the reliability measure comprises a risk reduction factor (RRF); and determining, via the processor, if an N-step ahead estimate of the average PFD exceeds a risk reduction factor (RRF), and if the N-step ahead estimate exceeds the RRF, then to command a proof test.

12. The method of claim 11, wherein the risk model comprises an X-out-of-N Markov model configured to use the at least one failure state, the one okay state, the at least one derated state, the at least one repair rate transition, and the at least one failure rate transition to model the reliability measure.

13. The method of claim 11, wherein the at least one failure state comprises a controller logic failure state.

14. The method of claim 11, wherein the input comprises a fault tolerance input, a maintenance policy input, a sensor input, or a combination thereof, and wherein the action comprises a maintencance action, an operational action, an economic action, or a combination thereof.

15. A system comprising:

a controller configured to control a machine system and to receive inputs from the machine system, wherein the controller comprises non-transitory machine readable instructions configured to:

use a model library to build a risk model;

derive a reliability measure based on the risk model, a system risk, and an input;

derive an action based on the reliability measure, wherein the risk model comprises at least one failure state, one okay state, at least one derated state, at least one repair rate transition, and at least one failure rate transition, wherein the system risk comprises an average probability of failure on demand (PFD) and wherein the reliability measure comprises a risk reduction factor (RRF); and determine if an N-step ahead estimate of the average PFD exceeds a risk reduction factor (RRF), and if the N-step ahead estimate exceeds the RRF, then to command a proof test.

16. The system of claim 15, wherein the controller comprises a single controller, a dual controller, a triple modular redundant (TMR) controller, or a combination thereof.

17. The system of claim 15, wherein the controller comprises a graphical user interface (GUI) configured to build the risk model.

18. The system of claim 15, wherein the risk model comprises an X-out-of-N (XooN) Markov model configured to use the at least one failure state, the one okay state, the at least one derated state, the at least one repair rate transition, and the at least one failure rate transition to model the reliability measure.

* * * * *